United States Patent
Bhargava

(10) Patent No.: US 9,691,455 B2
(45) Date of Patent: Jun. 27, 2017

(54) ADDRESS DECODING CIRCUITRY

(71) Applicant: ARM Limited, Cambridge (GB)

(72) Inventor: Mudit Bhargava, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/796,744

(22) Filed: Jul. 10, 2015

(65) Prior Publication Data

US 2017/0011788 A1 Jan. 12, 2017

(51) Int. Cl.
  *G11C 8/00* (2006.01)
  *G11C 8/10* (2006.01)
  *G11C 8/18* (2006.01)

(52) U.S. Cl.
  CPC . *G11C 8/10* (2013.01); *G11C 8/18* (2013.01)

(58) Field of Classification Search
  CPC .............. G11C 8/10; G11C 8/08; G06F 12/02
  USPC ........................................ 365/230.06, 230.03
  See application file for complete search history.

(56) References Cited

U.S. PATENT DOCUMENTS

| 5,784,330 A * | 7/1998 | Beck ................. G11C 8/14 365/230.01 |
| 2013/0235679 A1* | 9/2013 | Devulapalli ............. G11C 8/08 365/189.011 |
| 2013/0268727 A1* | 10/2013 | Sohn .................... G11C 8/00 711/105 |
| 2014/0119150 A1* | 5/2014 | Hyde ..................... G11C 8/10 365/230.06 |

OTHER PUBLICATIONS

Kang, et al.' "CMOS Digital Integrated Circuits, Analysis and Design"; Chapter 9; Third Edition; Tata McGraw-Hill; 2003.

* cited by examiner

*Primary Examiner* — Huan Hoang
(74) *Attorney, Agent, or Firm* — Pramudji Law Group PLLC; Ari Pramudji

(57) ABSTRACT

Various implementations described herein are directed to an integrated circuit for address decoding. The integrated circuit may include an input circuit configured to provide an encoded address via multiple address lines. The integrated circuit may include an address decoding circuit configured to directly translate the encoded address provided via the multiple address lines. The address decoding circuit may include multiple decoding blocks with each block having a first stage coupled to a second stage. The first stage of each block may include a first number of decoding transistors configured to decode first address bit values from the multiple address lines. The second stage of each block may include a second number of decoding transistors configured to decode second address data bit values from the multiple address lines. The integrated circuit may include an output circuit configured to provide a decoded address to a wordline driver circuit in memory.

17 Claims, 12 Drawing Sheets

ADDRESS DECODING CIRCUITRY

BACKGROUND

This section is intended to provide information relevant to understanding various technologies described herein. As the section's title implies, this is a description of related art that should in no way imply that it is prior art. Generally, related art may or may not be considered prior art. It should therefore be understood that any statement in this section should be read in this light, and not as any admission of prior art.

Integrated circuits include memory circuits to store and access data. During read/write operations, address decoding may typically involve pre-decode activities and post-decode activities. Typical/conventional handling of these decoding operations may adversely impact component and wiring area topologies of memory devices.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to address decoding circuitry. For instance, in some implementations, the address decoding circuitry described herein may be configured to directly translate an encoded address provided via multiple address lines to thereby selectively access at least one wordline from multiple wordlines in memory. The address decoding circuitry may include multiple decoding blocks with each block having multiple stages configured to decode one or more address bit values from the multiple address lines. The address decoding circuitry may further include input circuitry configured to provide the encoded address via the multiple address lines. The address decoding circuitry may further include output circuitry configured to provide a decoded address to a wordline driver circuit.

Various implementations of address decoding circuitry described herein will now be described in more detail with reference to FIGS. 1-5.

Figure 1:
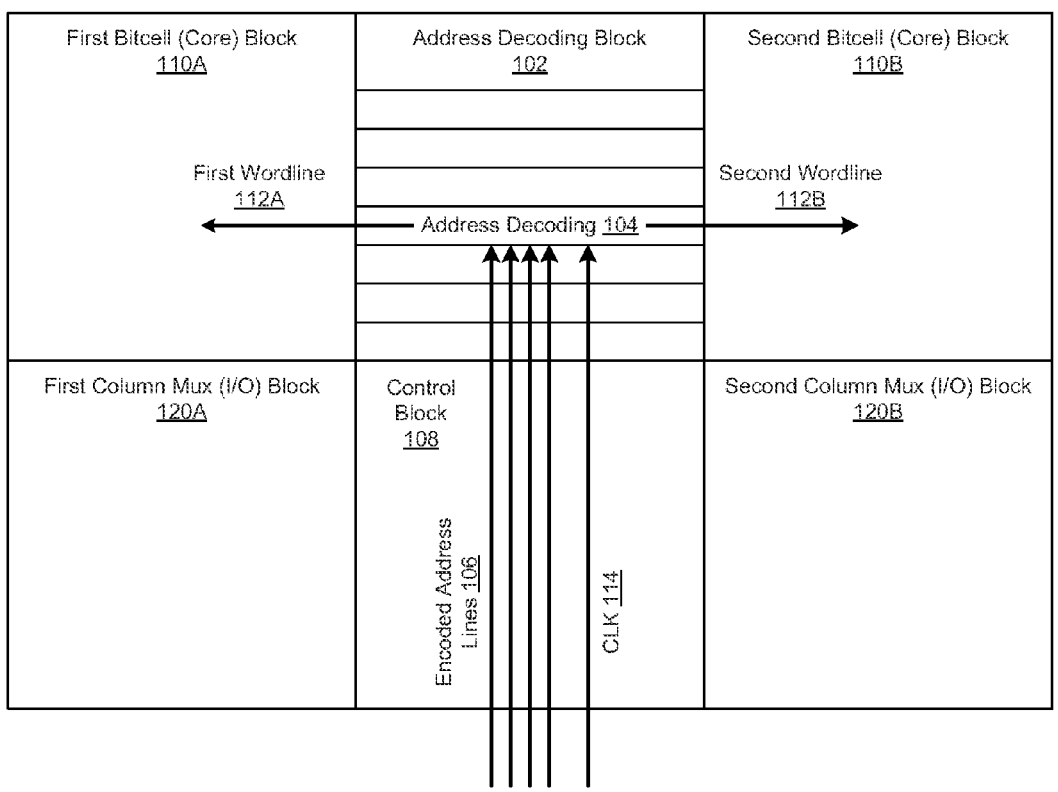
FIG. 1 illustrates a diagram of block level organization for memory device circuitry having address decoding circuitry in accordance with various implementations described herein.

FIG. 1 illustrates a diagram of block level organization (e.g., area topology) for memory device circuitry 100 having address decoding circuitry 102 in accordance with various implementations described herein. In some implementations, block level organization or area topology may refer to the memory device circuitry 100 having the address decoding circuitry 102 as an integrated component or part thereof. The address decoding circuitry 102 may be referred to as decoding circuitry and/or circuit.

In one implementation, the memory device circuitry 100 may be configured for address decoding using full dynamic decoding. More specifically, the memory device circuitry 100 may be configured to provide area efficient address decoding for use with decode logic circuitry for multi-port register files in memory without using pre-decoding logic circuitry for pre-decoding address bits. Such memory device circuitry 100 may provide for low wiring overhead and potentially lower area. Since the memory device circuitry 100 may not use any pre-decode logic, the number of components and/or devices in a control block 108 may be less. Further, the number of wires from the control block 108 to a post-decode block (e.g., an address decode block 102) may be less, which reduces the area that would otherwise be governed by wires. Further, the address setup time for addresses may be lower because the address path may be smaller (e.g., by at least 2 gate delays).

In a typical block level organization of an address decoding block in memory, each address may use two set of 2-to-4 pre-decoded signals. These 8 pre-decoded signals (4 from each set) are used to decode 4×4=16 rows. However, various implementations described herein refer to the memory device circuitry 100 that may be configured to use 4-to-16 decoding without use of pre-decode signals. This concept described herein may be extended for larger address widths.

The memory device circuitry 100 may include the address decoding circuitry 102 (which may be referred to as an address decoding block), a first bitcell (core) block 110A, and a second bitcell (core) block 110B. In various implementations, the address decoding block 102 may include multiple embedded hardware components (e.g., decoding transistors, etc.) configured to provide address decoding 104, including, e.g., 4-to-16 address decoding.

The memory device circuitry 100 may further include the control block 108, a first column multiplexor (mux) input/output (I/O) block 120A, and a second column mux (I/O) block 120B. In some implementations, when a write operation is performed, the control block 108 may provide control signals to wordline drivers associated with column mux circuitry 120A, 120B to thereby activate at least one particular row of memory cells via corresponding wordlines 112A, 112B. The control block 108 may further cause write driver circuitry associated with column mux circuitry 120A, 120B to control voltages on relevant write bitline pairs to thereby write data values in memory cells of the activated row. In some implementations, when a read operation is performed, the control block 108 may provide control signals to wordline drivers associated with column mux circuitry 120A, 120B to thereby activate a particular row of memory cells via corresponding wordlines 112A, 112B. Further, sense amplifier circuitry associated with the column mux circuitry 120A, 120B may be used to evaluate voltages on relevant read bitlines with the sensed read data being returned to the control block 108.

The address decoding block 102 may be configured to receive an encoded address as input via multiple address lines 106, which may include encoded address lines. The address decoding block 102 may include multiple decoding block circuits (as further described herein) configured to directly decode the encoded address provided via the multiple address lines 106. The multiple address block circuits may be configured to selectively access at least one wordline from multiple wordlines, including, e.g., a first wordline 112A and a second wordline 112B, in memory based on the decoded address. Each of the multiple decoding block circuits may include multiple stages (as further described herein) configured to decode one or more address bit values from the multiple address lines 106. The address decoding block 102 may include one full decode block for every row in memory.

In one implementation, the address decoding block 102 may be configured to use at least 5 (five) wire lines including, e.g., at least 4 (four) address lines of the multiple address lines 106 and, e.g., at least 1 (one) clock line 114. The at least 4 (four) address lines of the multiple address lines 106 may be configured to provide the encoded address to each block of the multiple decoding block circuits, and the at least 1 (one) clock line 114 may be configured to provide a clock signal (CLK) to each block of the multiple decoding block circuits.

In some implementations, the address decoding block 102 may be configured to directly translate the encoded address using only the multiple address lines 106. As shown in FIG. 1, the multiple address lines 106 may be configured to bypass a portion of the control block circuitry 108 for directly translating the encoded address using only the multiple address lines 106.

Figure 2:
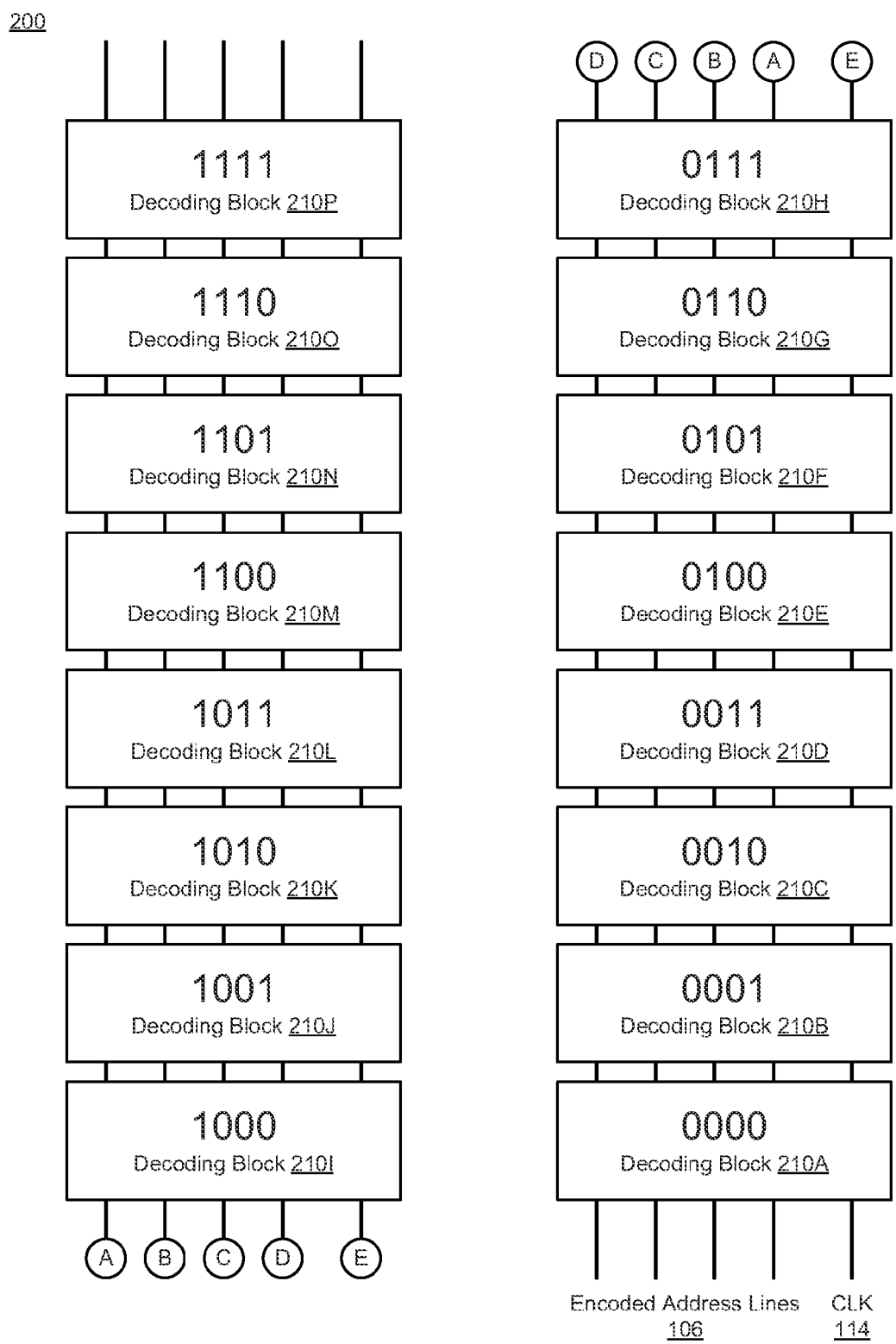
FIG. 2 illustrates a diagram of address decoding circuitry in accordance with various implementations described herein.

FIG. 2 illustrates a diagram of address decoding circuitry 200 in accordance with various implementations described herein. In one implementation, the address decoding circuitry 200 may refer to the address decoding block 102 of FIG. 1. The address decoding circuitry 200 may be referred to as decoding circuitry and/or circuit.

The address decoding circuitry 200 may include multiple decoding blocks, including, e.g., sixteen (16) separate decoding blocks 210A, 210B, . . . , 210P, to provide address decoding, including, e.g., 4-to-16 address decoding. Each of the 16 decode gates are different, and the coupling to each of these decoding blocks 210A, 210B, . . . , 210P is described further herein in reference to FIGS. 3A-3P.

As shown in FIG. 2, an encoded address may be provided to each decoding block 210A, 210B, . . . , 210P as input via multiple encoded address lines 106, including, e.g., at least 4 (four) address lines. The multiple encoded address lines 106 may refer to a first line A, a second line B, a third line C, and a fourth line D. Another input may be provided with at least 1 (one) clock line 114 configured to provide the clock signal (CLK) to each block of the multiple decoding blocks 210A, 210B, . . . , 210P. The clock line 114 may refer to a fifth line E. The multiple decoding blocks 210A, 210B, . . . , 210P may include at least 16 (sixteen) decoding blocks, and the decoded address bit values for each block of the at least 16 (sixteen) decoding blocks 210A, 210B, . . . , 210P may correspond to binary values for each block.

For instance, the binary value for a first block 210A may include 0000 that may be associated with a decimal value of 0 (zero). The binary value for a second block 210B may include 0001 that may be associated with a decimal value of 1 (one). The binary value for a third block 210C may include 0010 that may be associated with a decimal value of 2 (two). The binary value for a fourth block 210D may include 0011 that may be associated with a decimal value of 3 (three). The binary value for a fifth block 210E may include 0100 that may be associated with a decimal value of 4 (four). The binary value for a sixth block 210F may include 0101 that may be associated with a decimal value of 5 (five). The binary value for a seventh block 210G may include 0110 that may be associated with a decimal value of 6 (six).

Further, the binary value for an eighth block 210H may include 0111 that may be associated with a decimal value of 7 (seven). The binary value for a ninth block 210I may include 1000 that may be associated with a decimal value of 8 (eight). The binary value for a tenth block 210J may include 1001 that may be associated with a decimal value of 9 (nine). The binary value for an eleventh block 210K may include 1010 that may be associated with a decimal value of 10 (ten). The binary value for a twelfth block 210L may include 1011 that may be associated with a decimal value of 11 (eleven). The binary value for a thirteenth block 210M may include 1100 that may be associated with a decimal value of 12 (twelve). The binary value for a fourteenth block 210N may include 1011 that may be associated with a decimal value of 13 (thirteen). The binary value for a fifteenth block 210O may include 1110 that may be associated with a decimal value of 14 (fourteen). The binary value for a sixteenth block 210P may include 1111 that may be associated with a decimal value of 15 (fifteen).

Figure 3A:
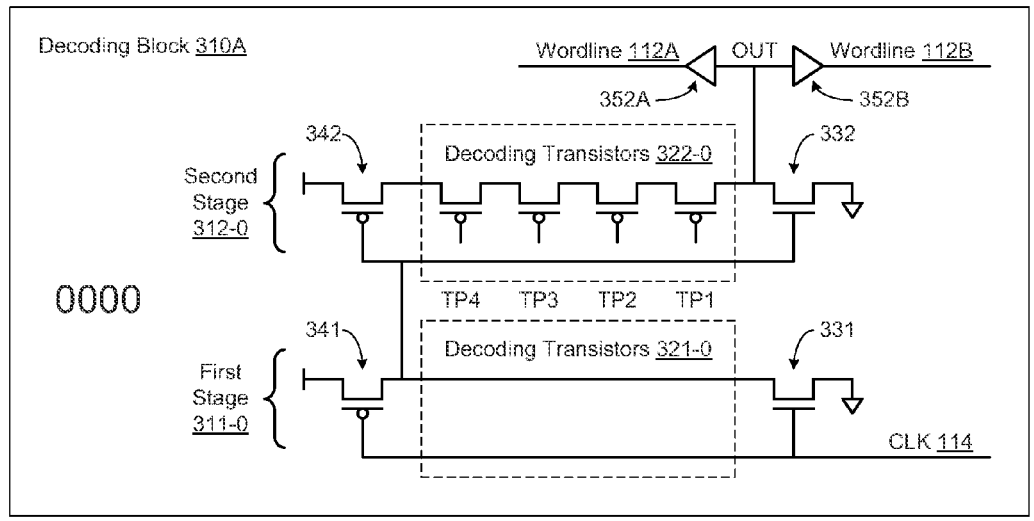
FIGS. 3A-3P illustrate various circuit diagrams of address decoding blocks in accordance with various implementations described herein.
Figure 3B:
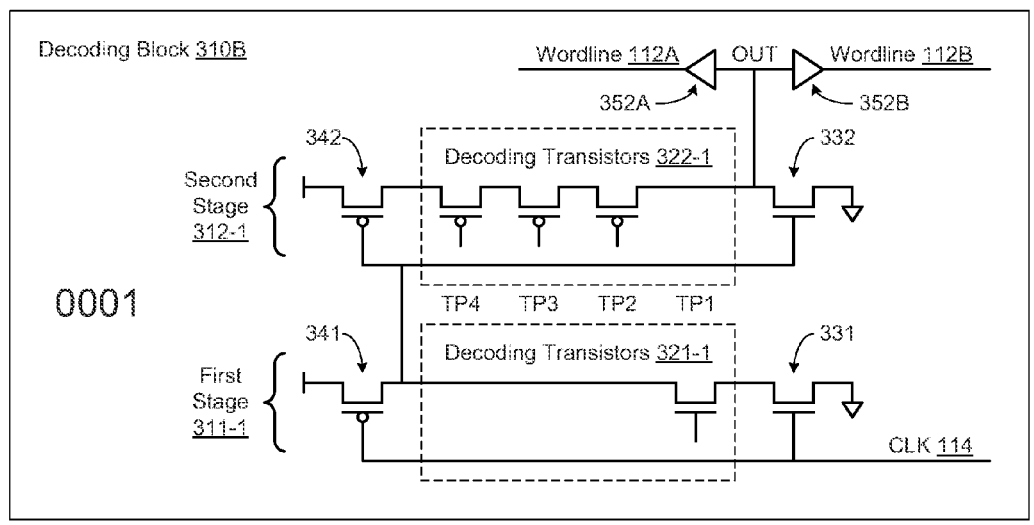
Figure 3C:
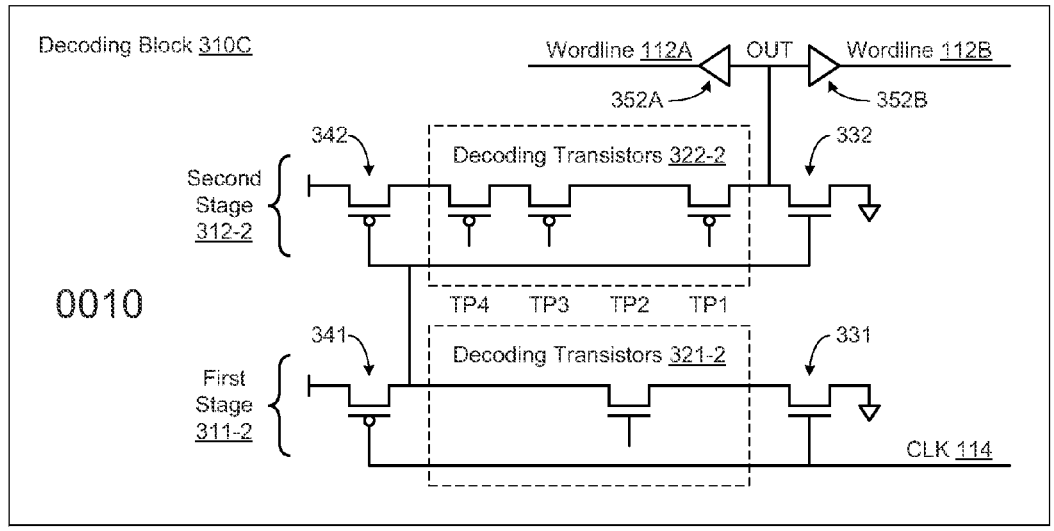
Figure 3D:
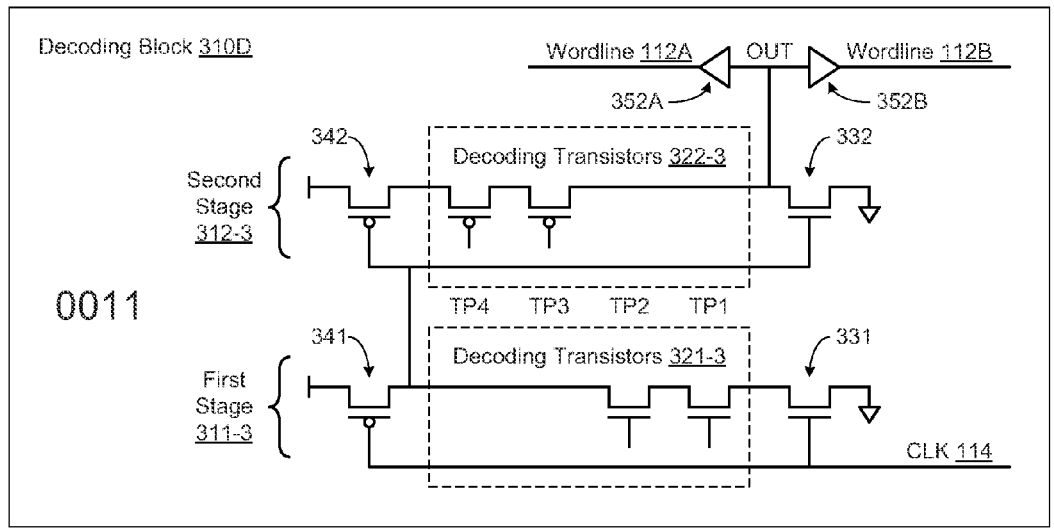
Figure 3E:
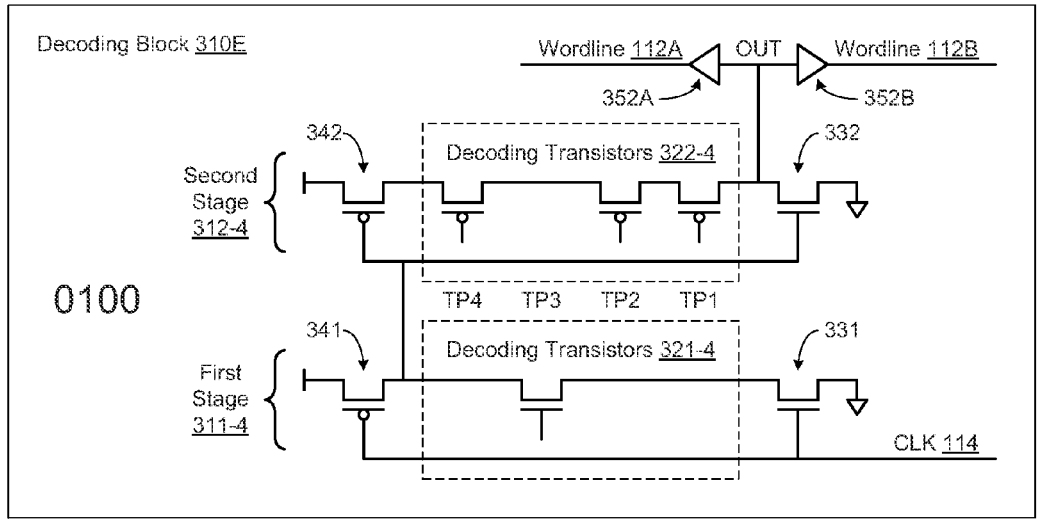
Figure 3F:
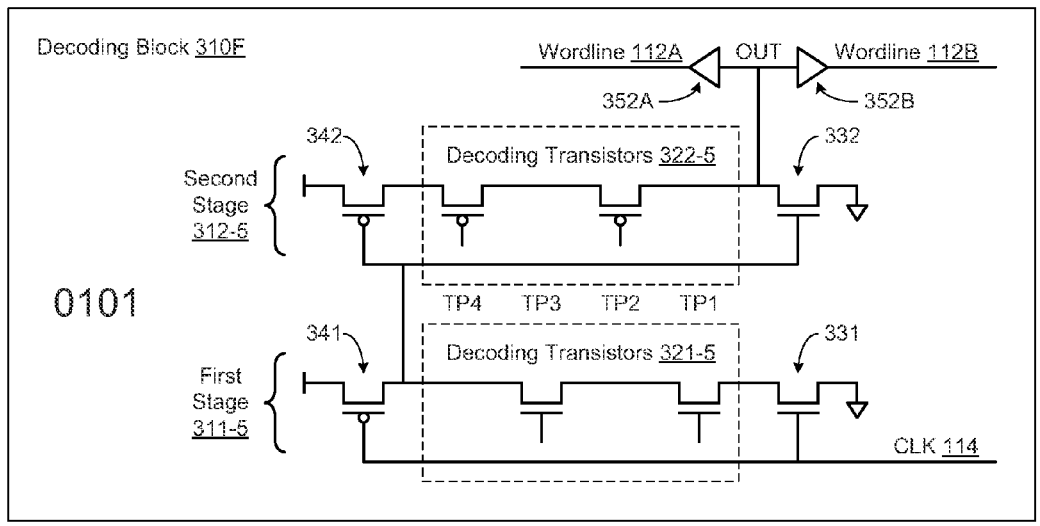
Figure 3G:
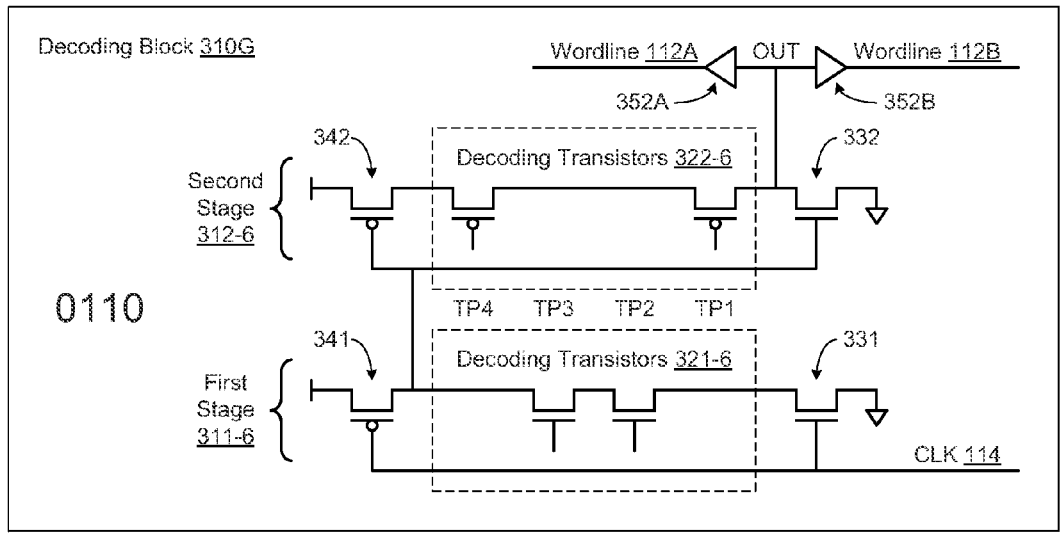
Figure 3H:
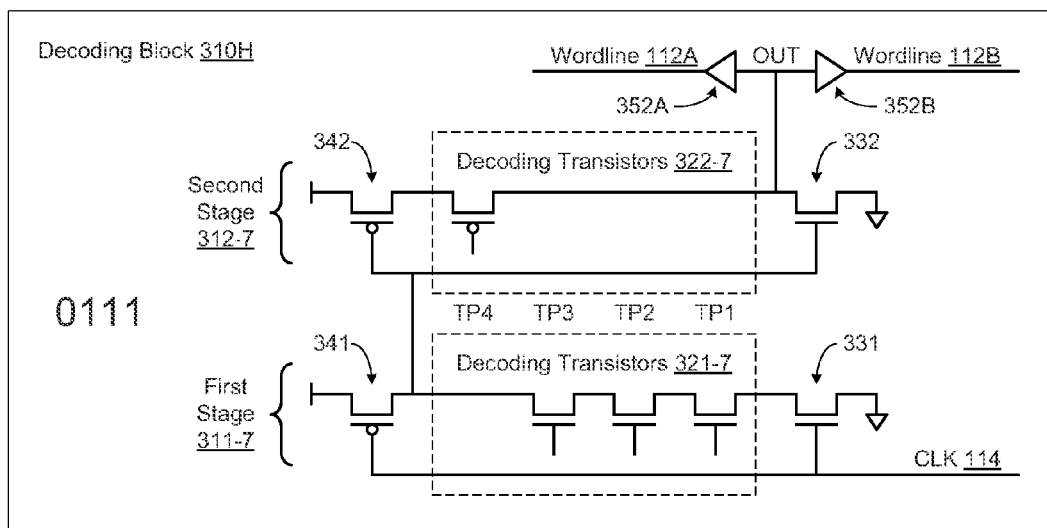
Figure 3I:
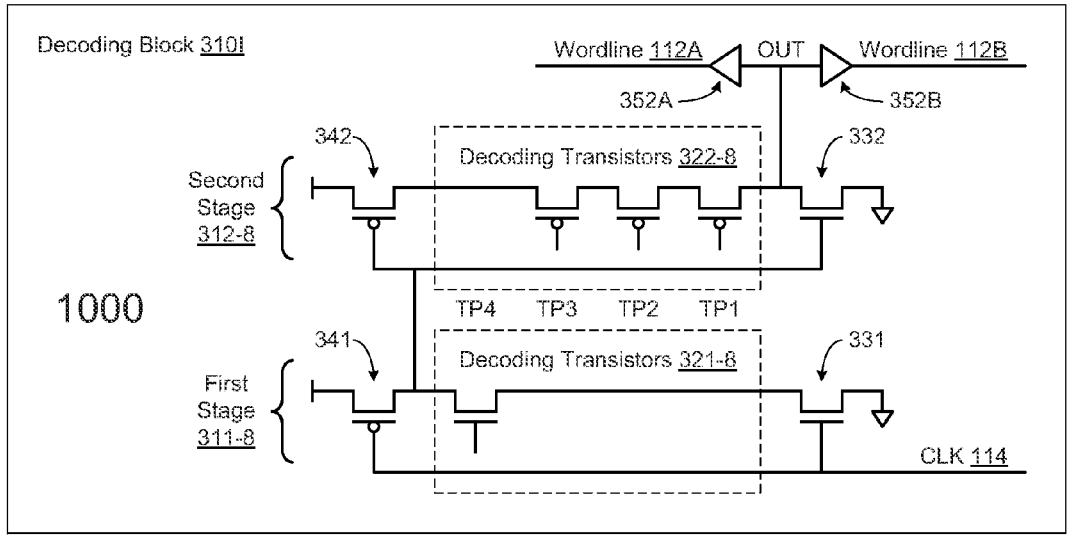
Figure 3J:
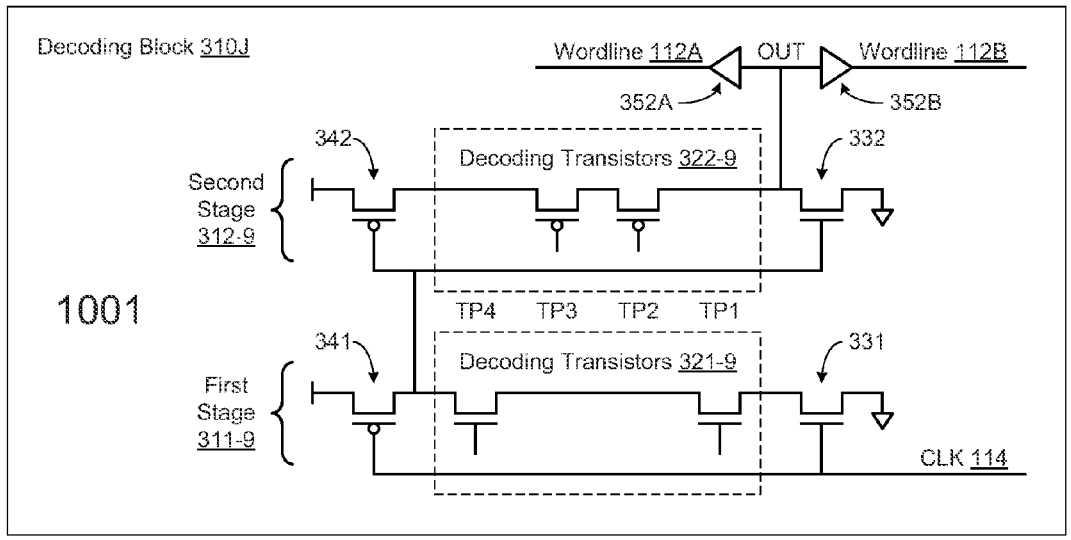
Figure 3K:
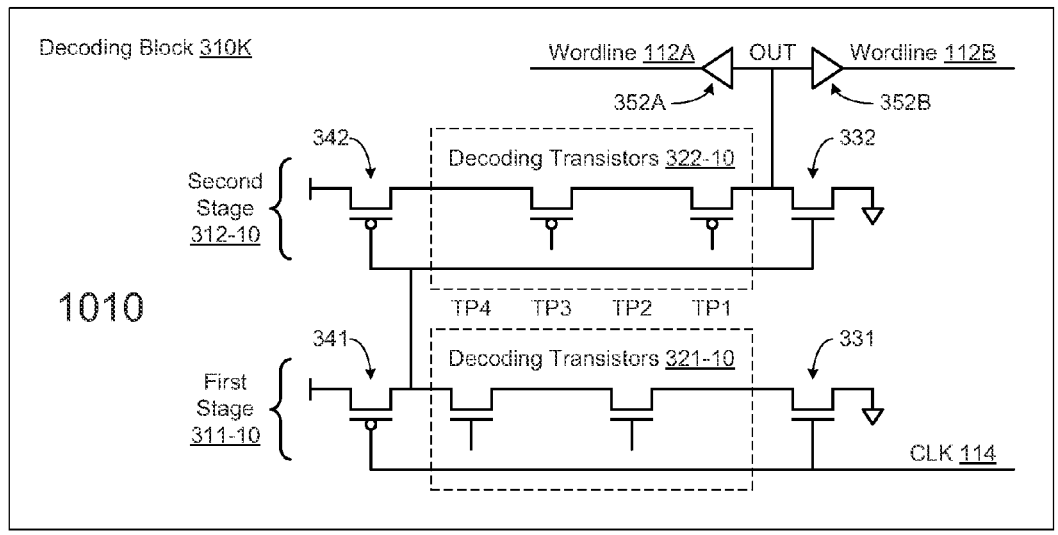
Figure 3L:
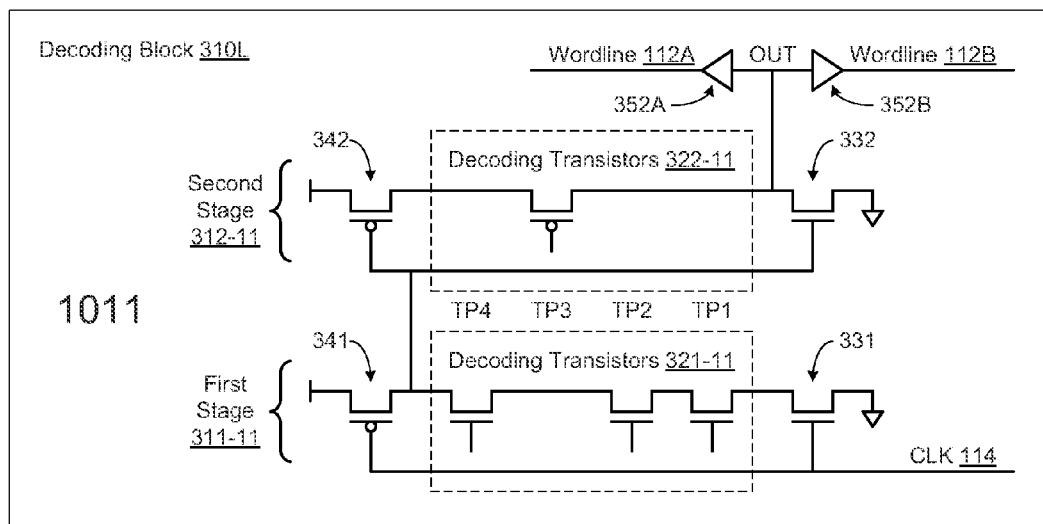
Figure 3M:
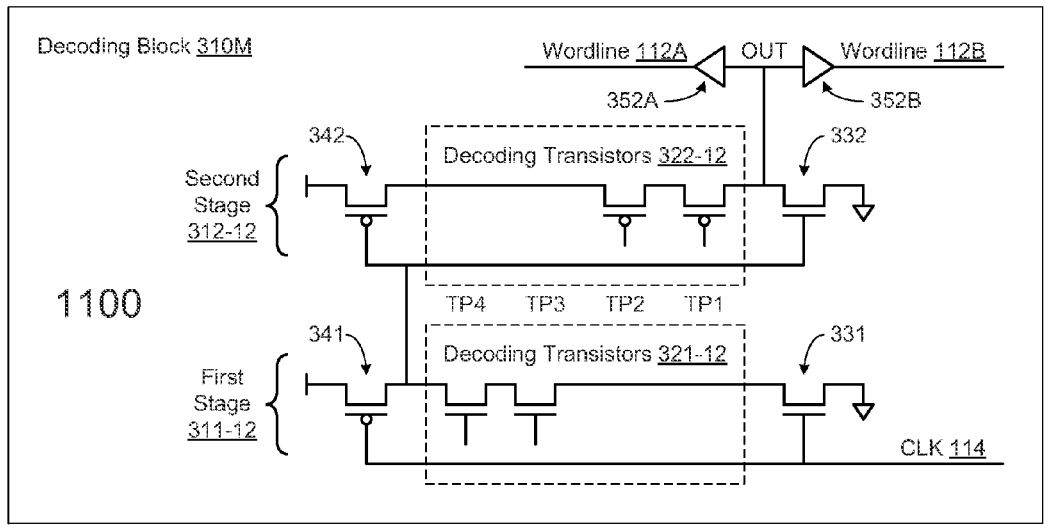
Figure 3N:
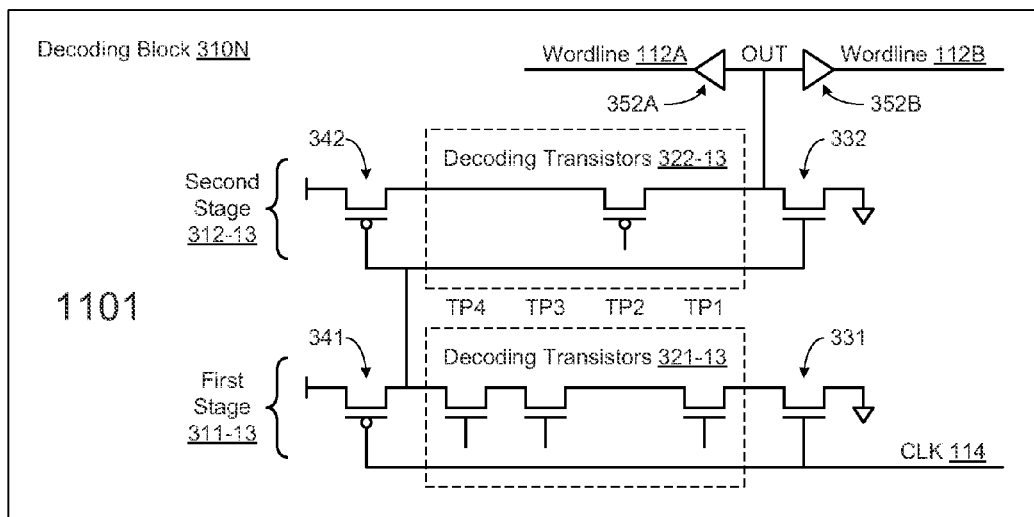
Figure 3O:
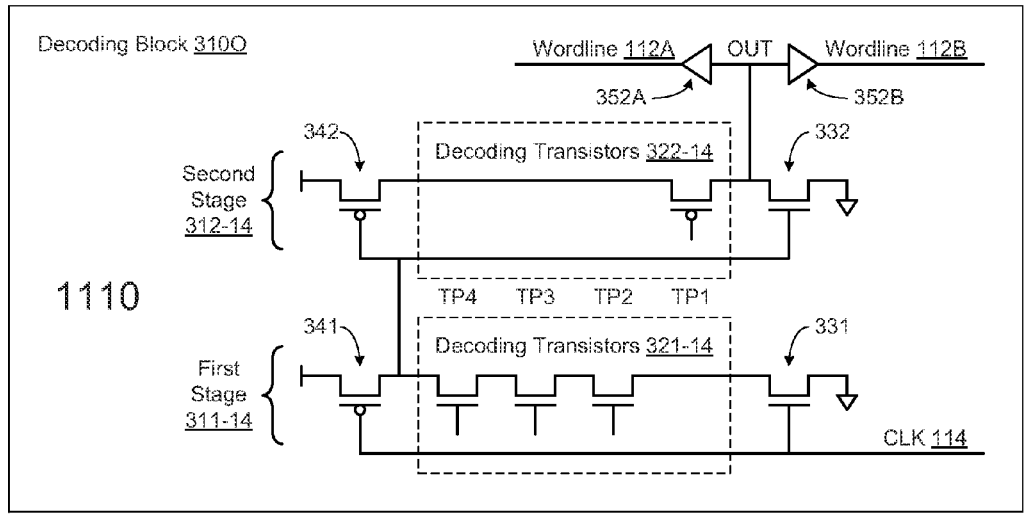
Figure 3P:
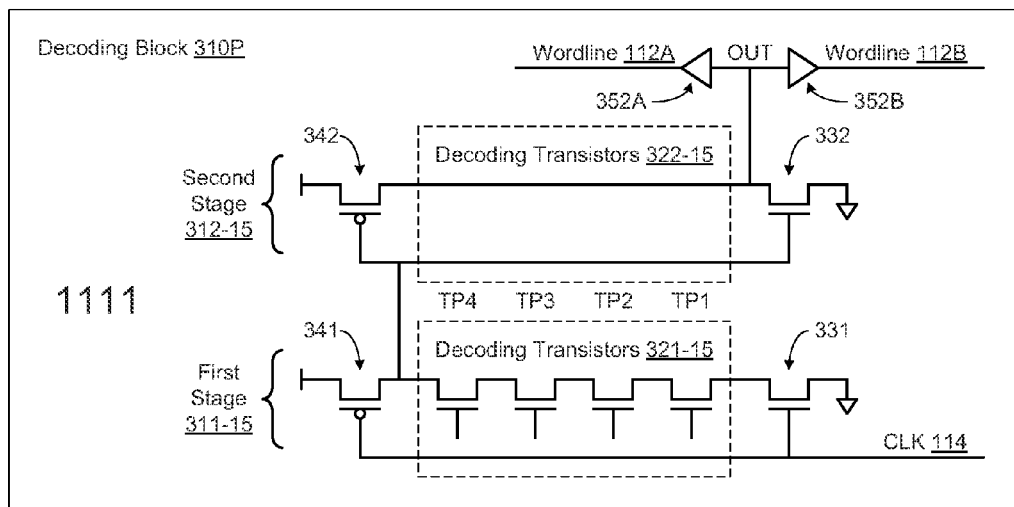

FIGS. 3A-3P illustrate various circuit diagrams 300A, 300B, . . . , 300P of corresponding address decoding block 310A, 310B, . . . , 310P in accordance with various implementations described herein. As shown in FIGS. 3A-3P, each address decoding block 310A, 310B, . . . , 310P may include specific address decoding circuitry for decoding a specific encoded address associated therewith. The address decoding circuitry for each address decoding block 310A, 310B, . . . , 310P may be implemented with multiple stages, and each of the sixteen (16) address decoding blocks 310A, 310B, . . . , 310P are different and include different circuit arrangements. Each of the address decoding block 310A, 310B, . . . , 310P may be referred to as full dynamic decode blocks having full dynamic decode gates configured for, e.g., 4-to-16 address decoding. In various instances, the address decoding blocks 310A, 310B, . . . , 310P may be referred to as dynamic decode gates or dynamic decoding gates.

In various implementations, the address decoding circuitry for each address decoding block 310A, 310B, . . . , 310P may be configured to directly translate a specific encoded address provided via multiple address lines. Each address decoding block 310A, 310B, . . . , 310P may include a first stage 311 coupled to a second stage 312. The first stage 311 of each address decoding block 310A, 310B, . . . , 310P may include a first number of decoding transistors 321 that are configured to decode first address bit values from the multiple address lines. The second stage 312 of each address decoding block 310A, 310B, . . . , 310P may include a second number of decoding transistors 322 that are configured to decode second address data bit values from the multiple address lines. As described further herein, the first address bit values are different than the second address bit values. Further, in some implementations, the decoding transistors 321, 322 may comprise smaller devices than those devices found in typical/conventional approaches/applications.

As shown in FIGS. 3A-3P, each decoding transistor of the first number of decoding transistors 321 of each first stage 311 may comprise an n-type metal-oxide-semiconductor (NMOS) transistor. Each first stage 311 may be configured to decode first address bit values associated with a data bit value of binary 1 (one) from each of the multiple address lines. Each decoding transistor of the second number of decoding transistors 322 of each second stage 312 may comprise a p-type metal-oxide-semiconductor (PMOS) transistor. Each second stage 312 may be configured to decode second address bit values associated with a data bit value of binary 0 (zero) from each of the multiple address lines.

As shown in FIGS. 3A-3P, each address decoding block 310A, 310B, . . . , 310P may comprise a combination of at least 4 (four) decoding transistors for decoding the first and second address bit values from the multiple address lines. The first number of decoding transistors 321 of each first stage 311 may comprise a number of 0 (zero) to 4 (four) decoding transistors configured to decode the first address bit values from the multiple address lines. The second number of decoding transistors 322 of each second stage 312 may comprise a number of 0 (zero) to 4 (four) decoding transistors configured to decode the second address bit values from the multiple address lines.

As described herein, a clock circuit may be configured to provide a clock signal (CLK) to each address decoding block 310A, 310B, . . . , 310P. Thus, as shown in FIGS. 3A-3P, the first stage 311 for each address decoding block 310A, 310B, . . . , 310P may include first and second input transistors 331, 341 with the decoding transistors of the first number of decoding transistors 321 interposed therebetween. Further, the clock circuit may provide the clock signal (CLK) to a gate of each first input transistor 331 and a gate of each second input transistor 341. Each first input transistor 331 of the first stage 311 for each address decoding block 310A, 310B, . . . , 310P may comprise a NMOS transistor. Each second input transistor 341 of the first stage 311 for each address decoding block 310A, 310B, . . . , 310P may comprise a PMOS transistor.

As shown in FIGS. 3A-3P, the second stage 312 for each address decoding block 310A, 310B, . . . , 310P may include first and second output transistors 332, 342 with the decoding transistors of the second number of decoding transistors 322 interposed therebetween. Further, the first stage 311 for each address decoding block 310A, 310B, . . . , 310P may provide a first decoding signal to a gate of each first output transistor 341 and a gate of each second output transistor 342. The second stage 312 for each address decoding block 310A, 310B, . . . , 310P may provide a second decoding signal to an output circuit OUT, including, e.g., first and second NOT gates 352A, 352B, for selectively accessing the at least one wordline from the multiple wordlines in the memory via the first and second NOT gates 352A, 352B. Further, each first output transistor 332 of the second stage 312 for each address decoding block 310A, 310B, . . . , 310P may comprise a NMOS transistor. Each second output transistor 342 of the second stage 312 for each address decoding block 310A, 310B, . . . , 310P may comprise PMOS transistor.

FIG. 3A illustrates a first circuit diagram 300A for a first address decoding block 310A in accordance with an implementation described herein. As shown in FIG. 3A, the decoded address bit values for the first address decoding block 310A may correspond to a first decoded binary value of 0000 associated with, e.g., a decimal value of 0 (zero). For the first address decoding block 310A, a first stage 311-0 may comprise of 0 (zero) decoding transistors 321-0 that may be arranged in a configuration (e.g., transistor positions none) to decode the first address bit values from the multiple address lines, and a second stage 312-0 may comprise of 4 (four) decoding transistors 322-0 that may be arranged in a configuration (e.g., transistor positions TP1, TP2, TP3, TP4) to decode the second address bit values from the multiple address lines.

FIG. 3B illustrates a second circuit diagram 300B for a second address decoding block 310B in accordance with an implementation described herein. As shown in FIG. 3B, the decoded address bit values for the second address decoding block 310B may correspond to a first decoded binary value of 0001 associated with, e.g., a decimal value of 1 (one). For the second address decoding block 310B, a first stage 311-1 may comprise of 1 (one) decoding transistor 321-1 that may be arranged in a configuration (e.g., transistor positions TP1) to decode the first address bit values from the multiple address lines, and a second stage 312-1 may comprise of 3 (three) decoding transistors 322-1 that may be arranged in a configuration (e.g., transistor positions TP2, TP3, TP4) to decode the second address bit values from the multiple address lines.

FIG. 3C illustrates a third circuit diagram 300C for a third address decoding block 310C in accordance with an implementation described herein. As shown in FIG. 3C, the decoded address bit values for the third address decoding block 310C may correspond to a first decoded binary value of 0010 associated with, e.g., a decimal value of 2 (two). For the third address decoding block 310C, a first stage 311-2 may comprise of 1 (one) decoding transistor 321-2 that may be arranged in a configuration (e.g., transistor positions TP2) to decode the first address bit values from the multiple address lines, and a second stage 312-2 may comprise of 3 (three) decoding transistors 322-2 that may be arranged in a configuration (e.g., transistor positions TP1, TP3, TP4) to decode the second address bit values from the multiple address lines.

FIG. 3D illustrates a fourth circuit diagram 300D for a fourth address decoding block 310D in accordance with an implementation described herein. As shown in FIG. 3D, the decoded address bit values for the fourth address decoding block 310D may correspond to a first decoded binary value of 0011 associated with, e.g., a decimal value of 3 (three). For the fourth address decoding block 310D, a first stage 311-3 may comprise of 2 (two) decoding transistors 321-3 that may be arranged in a configuration (e.g., transistor positions TP1, TP2) to decode the first address bit values from the multiple address lines, and a second stage 312-3 may comprise of 2 (two) decoding transistors 322-3 that may be arranged in a configuration (e.g., transistor positions TP3, TP4) to decode the second address bit values from the multiple address lines.

FIG. 3E illustrates a fifth circuit diagram 300E for a fifth address decoding block 310E in accordance with an implementation described herein. As shown in FIG. 3E, the decoded address bit values for the fifth address decoding block 310E may correspond to a first decoded binary value of 0100 associated with, e.g., a decimal value of 4 (four). For the fifth address decoding block 310E, a first stage 311-4 may comprise of 1 (one) decoding transistor 321-4 that may be arranged in a configuration (e.g., transistor positions TP3) to decode the first address bit values from the multiple address lines, and a second stage 312-4 may comprise of 3 (three) decoding transistors 322-4 that may be arranged in a configuration (e.g., transistor positions TP1, TP2, TP4) to decode the second address bit values from the multiple address lines.

FIG. 3F illustrates a sixth circuit diagram 300F for a sixth address decoding block 310F in accordance with an implementation described herein. As shown in FIG. 3F, the decoded address bit values for the sixth address decoding block 310F may correspond to a first decoded binary value of 0101 associated with, e.g., a decimal value of 5 (five). For the sixth address decoding block 310F, a first stage 311-5 may comprise of 2 (two) decoding transistors 321-5 that may be arranged in a configuration (e.g., transistor positions TP2, TP4) to decode the first address bit values from the multiple address lines, and a second stage 312-5 may comprise of 2 (two) decoding transistors 322-5 that may be arranged in a configuration (e.g., transistor positions TP1, TP3) to decode the second address bit values from the multiple address lines.

FIG. 3G illustrates a seventh circuit diagram 300G for a seventh address decoding block 310G in accordance with an implementation described herein. As shown in FIG. 3G, the decoded address bit values for the seventh address decoding block 310G may correspond to a first decoded binary value of 0110 associated with, e.g., a decimal value of 6 (six). For the seventh address decoding block 310G, a first stage 311-6 may comprise of 2 (two) decoding transistors 321-6 that may be arranged in a configuration (e.g., transistor positions TP2, TP3) to decode the first address bit values from the multiple address lines, and a second stage 312-6 may comprise of 2 (two) decoding transistors 322-6 that may be arranged in a configuration (e.g., transistor positions TP1, TP4) to decode the second address bit values from the multiple address lines.

FIG. 3H illustrates an eighth circuit diagram 300H for an eighth address decoding block 310H in accordance with an implementation described herein. As shown in FIG. 3H, the decoded address bit values for the eighth address decoding block 310H may correspond to a first decoded binary value of 0111 associated with, e.g., a decimal value of 7 (seven). For the eighth address decoding block 310H, a first stage 311-7 may comprise of 3 (three) decoding transistors 321-7 that may be arranged in a configuration (e.g., transistor positions TP1, TP2, TP3) to decode the first address bit values from the multiple address lines, and a second stage 312-7 may comprise of 1 (one) decoding transistor 322-7 that may be arranged in a configuration (e.g., transistor positions TP4) to decode the second address bit values from the multiple address lines.

FIG. 3I illustrates a ninth circuit diagram 300I for a ninth address decoding block 310I in accordance with an implementation described herein. As shown in FIG. 3I, the decoded address bit values for the ninth address decoding block 310I may correspond to a first decoded binary value of 1000 associated with, e.g., a decimal value of 8 (eight). For the ninth address decoding block 310I, a first stage 311-8 may comprise of 1 (one) decoding transistor 321-8 that may be arranged in a configuration (e.g., transistor positions TP4) to decode the first address bit values from the multiple address lines, and a second stage 312-8 may comprise of 3 (three) decoding transistors 322-8 that may be arranged in a configuration (e.g., transistor positions TP1, TP2, TP3) to decode the second address bit values from the multiple address lines.

FIG. 3J illustrates a tenth circuit diagram 300J for a tenth address decoding block 310J in accordance with an implementation described herein. As shown in FIG. 3J, the decoded address bit values for the tenth address decoding block 310J may correspond to a first decoded binary value of 1001 associated with, e.g., a decimal value of 9 (nine). For the tenth address decoding block 310J, a first stage 311-9 may comprise of 2 (two) decoding transistors 321-9 that may be arranged in a configuration (e.g., transistor positions TP1, TP4) to decode the first address bit values from the multiple address lines, and a second stage 312-9 may comprise of 2 (two) decoding transistors 322-9 that may be arranged in a configuration (e.g., transistor positions TP2, TP3) to decode the second address bit values from the multiple address lines.

FIG. 3K illustrates an eleventh circuit diagram 300K for an eleventh address decoding block 310K in accordance with an implementation described herein. As shown in FIG. 3K, the decoded address bit values for the eleventh address decoding block 310K may correspond to a first decoded binary value of 1010 associated with, e.g., a decimal value of 10 (ten). For the eleventh address decoding block 310K, a first stage 311-10 may comprise of 2 (two) decoding transistors 321-10 that may be arranged in a configuration (e.g., transistor positions TP2, TP4) to decode the first address bit values from the multiple address lines, and a second stage 312-10 may comprise of 2 (two) decoding transistors 322-10 that may be arranged in a configuration (e.g., transistor positions TP1, TP3) to decode the second address bit values from the multiple address lines.

FIG. 3L illustrates a twelfth circuit diagram 300L for a twelfth address decoding block 310L in accordance with an implementation described herein. As shown in FIG. 3L, the decoded address bit values for the twelfth address decoding block 310L may correspond to a first decoded binary value of 1011 associated with, e.g., a decimal value of 11 (eleven). For the twelfth address decoding block 310L, a first stage 311-11 may comprise of 3 (three) decoding transistors 321-11 that may be arranged in a configuration (e.g., transistor positions TP1, TP2, TP4) to decode the first address bit values from the multiple address lines, and a second stage 312-11 may comprise of 1 (one) decoding transistor 322-11 that may be arranged in a configuration (e.g., transistor positions TP3) to decode the second address bit values from the multiple address lines.

FIG. 3M illustrates a thirteenth circuit diagram 300M for a thirteenth address decoding block 310M in accordance with an implementation described herein. As shown in FIG. 3M, the decoded address bit values for the thirteenth address decoding block 310M may correspond to a first decoded binary value of 1100 associated with, e.g., a decimal value of 12 (twelve). For the thirteenth address decoding block 310M, a first stage 311-12 may comprise of 2 (two) decoding transistors 321-12 that may be arranged in a configuration (e.g., transistor positions TP3, TP4) to decode the first address bit values from the multiple address lines, and a second stage 312-12 may comprise of 2 (two) decoding transistors 322-12 that may be arranged in a configuration (e.g., transistor positions TP1, TP2) to decode the second address bit values from the multiple address lines.

FIG. 3N illustrates a fourteenth circuit diagram 300N for a fourteenth address decoding block 310N in accordance with an implementation described herein. As shown in FIG. 3N, the decoded address bit values for the fourteenth address decoding block 310N may correspond to a first decoded binary value of 1101 associated with, e.g., a decimal value of 13 (thirteen). For the fourteenth address decoding block 310N, a first stage 311-13 may comprise of 3 (three) decoding transistors 321-13 that may be arranged in a configuration (e.g., transistor positions TP1, TP3, TP4) to decode the first address bit values from the multiple address lines, and a second stage 312-13 may comprise of 1 (one) decoding transistor 322-13 that may be arranged in a configuration (e.g., transistor positions TP2) to decode the second address bit values from the multiple address lines.

FIG. 3O illustrates a fifteenth circuit diagram 300O for a fifteenth address decoding block 310O in accordance with an implementation described herein. As shown in FIG. 3O, the decoded address bit values for the fifteenth address decoding block 310O may correspond to a first decoded binary value of 1110 associated with, e.g., a decimal value of 14 (fourteen). For the fifteenth address decoding block 310O, a first stage 311-14 may comprise of 3 (three) decoding transistors 321-14 that may be arranged in a configuration (e.g., transistor positions TP2, TP3, TP4) to decode the first address bit values from the multiple address lines, and a second stage 312-14 may comprise of 1 (one) decoding transistor 322-14 that may be arranged in a configuration (e.g., transistor positions TP1) to decode the second address bit values from the multiple address lines.

FIG. 3P illustrates a sixteenth circuit diagram 300P for a sixteenth address decoding block 310P in accordance with an implementation described herein. As shown in FIG. 3P, the decoded address bit values for the sixteenth address decoding block 310P may correspond to a first decoded binary value of 1111 associated with, e.g., a decimal value of 15 (fifteen). For the sixteenth address decoding block 310P, a first stage 311-15 may comprise of 4 (four) decoding transistors 321-15 that may be arranged in a configuration (e.g., transistor positions TP1, TP2, TP3, TP4) to decode the first address bit values from the multiple address lines, and a second stage 312-15 may comprise of 0 (zero) decoding transistors 322-15 that may be arranged in a configuration (e.g., transistor positions none) to decode the second address bit values from the multiple address lines.

In an example scenario, referring to FIG. 3C and FIG. 3O, an instance of address bits provided via the encoded address lines 106 may provide a 0010 for a decoded address (A) selection. In this scenario, the gate for row=0010 (i.e., gate 0010) and the gate for row=1110 (i.e., gate 1110) may respond to this address (A) selection as follows. Further, in this scenario, only gate 0010 may be expected to have OUT=1 for A=0010. Referring to FIG. 3C, for gate 0010 and A=0010, when CLK 114 goes high, the NMOS of the first stage 321-2 may have a 1, resulting in a net first stage output going to 0. The 3 other PMOS in the second stage 322-2 may also have 0 as their gate input, resulting in OUT=1 as the second stage output (i.e., row selected, as expected). Referring to FIG. 3O, for gate 1110 and A=0010, when CLK 114 goes high, the 2 NMOS on the left in the first stage 321-14 may have 0 at their gate and are hence switched off. Thus, the net output of the first stage 321-14 may not discharge and stays at 1. Hence, OUT for the output of the second stage 322-14 may stay at 0 (i.e., row not selected, as expected).

Figure 4:
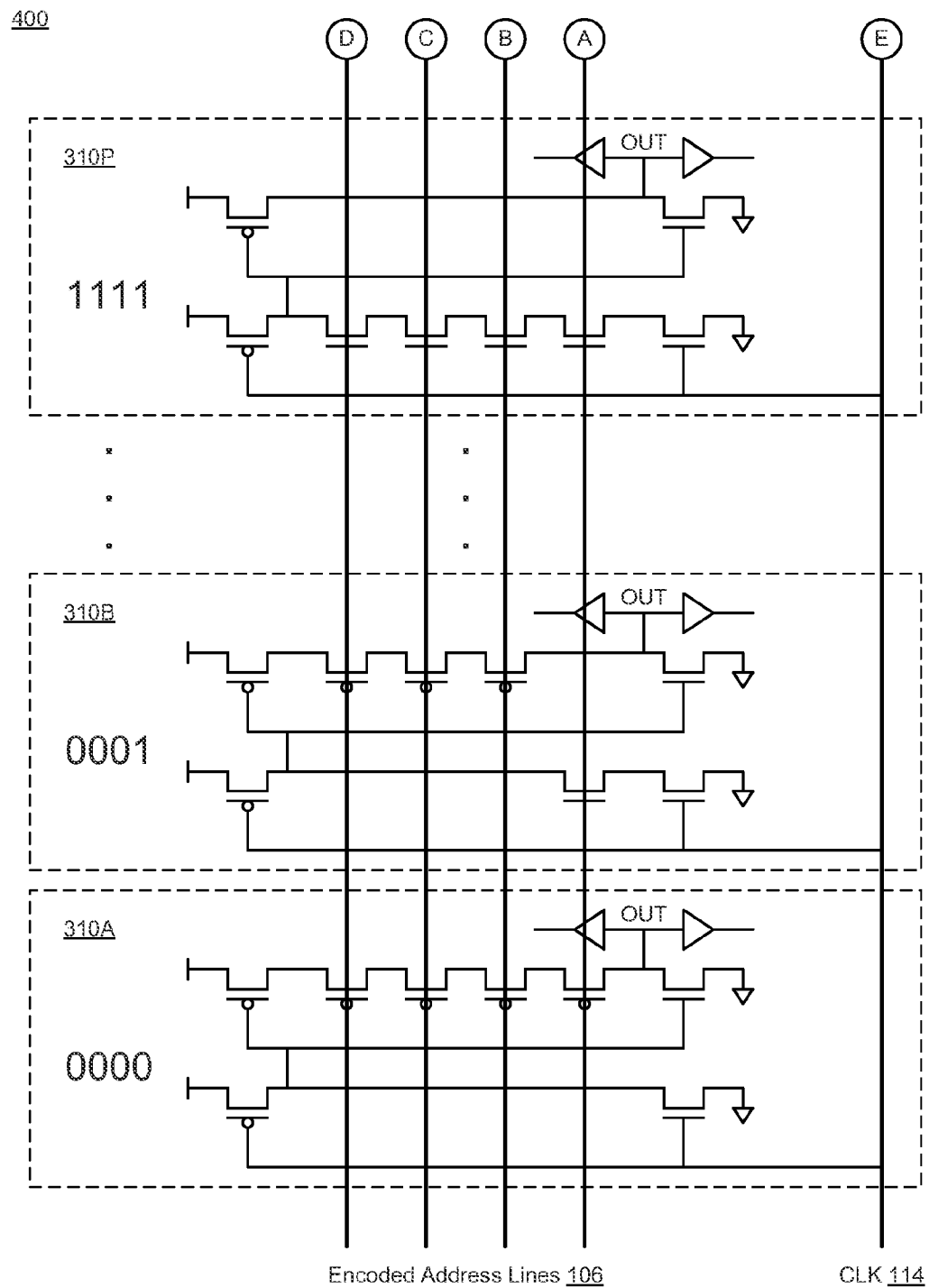
FIG. 4 illustrates a diagram of address decoding circuitry in accordance with various implementations described herein.

FIG. 4 illustrates a diagram of address decoding circuitry 400 in accordance with various implementations described herein. In various implementations, the address decoding circuitry 400 includes an integrated circuit having multiple components, devices, and/or wires electrically coupled together. These may be provided in an arrangement configured for address decoding, such as, e.g., area efficient address decoding without using a pre-decoding circuitry and pre-decoding address bits.

The address decoding circuitry 400 may include an input circuit configured to provide an encoded address via multiple encoded address lines 106. For instance, in some implementations, the multiple encoded address lines 106 may include a first encoded address line A, a second encoded address line B, a third encoded address line C, and a fourth encoded address line D.

The address decoding circuit 400 may be configured to directly translate the encoded address provided via the multiple encoded address lines 106 to thereby selectively access at least one wordline from multiple wordlines in memory via an output circuit OUT, as described above. The address decoding circuitry 400 may include multiple decoding blocks 310A, 310B, . . . , 310P with each block having a first stage coupled to a second stage, as described above. The first stage of each block may include a first number of decoding transistors configured to decode first address bit values from the multiple address lines, and the second stage of each block may include a second number of decoding transistors configured to decode second address data bit values from the multiple address lines. The first address bit values may be different than the second address bit values, as mentioned above.

The address decoding circuitry 400 may include the output circuit OUT for each block. The output circuit OUT may be configured to provide a decoded address to a wordline driver circuit to thereby selectively access the at least one wordline from the multiple wordlines in the memory.

In some implementations, the address decoding circuitry 400 may be comprised of a 4-to-16 decoding circuit. For instance, the multiple encoded address lines 106 may include at least 4 (four) address lines A, B, C, D, and the multiple decoding blocks 310A, 310B, . . . , 310P may include at least 16 (sixteen) decoding blocks, e.g., as described herein in reference to FIGS. 2 and 3A-3P.

In some implementations, the address decoding circuitry 400 may include input circuitry that may be configured to use only 5 (five) input wire lines, including the 4 (four) encoded address lines A, B, C, D and 1 (one) clock line E. The 4 (four) encoded address lines A, B, C, D may be configured to provide the encoded address to each decoding block of the multiple decoding blocks 310A, 310B, . . . , 310P, and the 1 (one) clock line E may be configured to provide a clock signal CLK 114 to each decoding block of the multiple decoding blocks 310A, 310B, . . . , 310P.

In some implementations, the address decoding circuitry 400 may be configured to directly translate the encoded address using only the multiple address lines, e.g., A, B, C, D. Further, in some implementations, the multiple address lines A, B, C, D may be configured to bypass a control circuit (e.g., circuitry related to the control block 108 of FIG. 1) for directly translating the encoded address using only the multiple address lines, e.g., A, B, C, D. In some other implementations, the multiple address lines, e.g., A, B, C, D, may be provided from a control circuit (e.g., circuitry related to the control block 108 of FIG. 1) to the decoding transistors, which may be referred to, e.g., as full dynamic decode gates).

Figure 5:
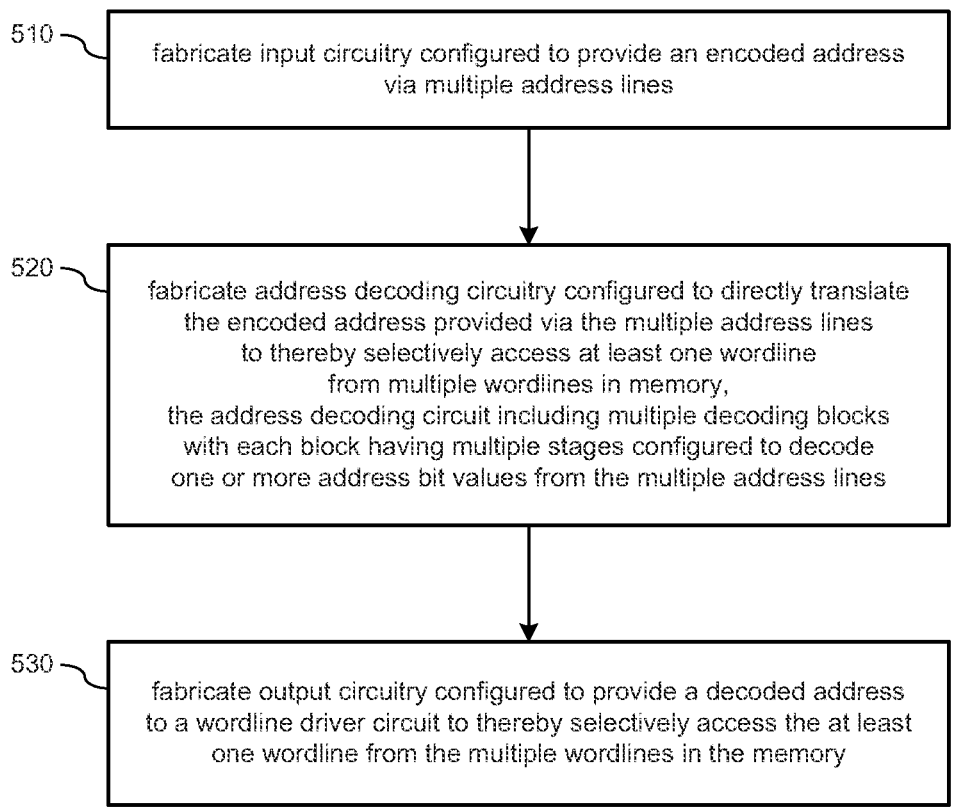
FIG. 5 illustrates a process flow diagram for a method of manufacture of address decoding circuitry in accordance with implementations described herein.

FIG. 5 illustrates a process flow diagram for a method of manufacture of address decoding circuitry in accordance with implementations described herein.

It should be understood that while method 500 indicates a particular order of execution of operations, in some examples, certain portions of the operations might be executed in a different order, and on different systems. In some other examples, one or more additional operations and/or steps may be added to method 500. Similarly, some operations and/or steps may be omitted.

Steps 510-530 are described with reference to FIGS. 2 and 3A-3P. At block 510, method 500 may fabricate input circuitry configured to provide an encoded address as input via multiple address lines. In some implementations, the input circuitry may include a clock circuit configured to provide a clock signal as an input.

At block 520, method 500 may fabricate address decoding circuitry configured to directly translate the encoded address provided via the multiple address lines to thereby selectively access at least one wordline from multiple wordlines in memory. The address decoding circuit may include multiple decoding blocks with each block having multiple stages configured to decode one or more address bit values from the multiple address lines. In some implementations, each of the multiple stages of each block may include a first stage coupled to a second stage. The first stage of each block may include a first number of decoding transistors configured to decode first address bit values from the multiple address lines. The second stage of each block may include a second number of decoding transistors configured to decode second address data bit values from the multiple address lines. The clock circuit may be configured to provide the clock signal to each block of the multiple decoding blocks. The first stage for each block of the multiple decoding blocks may include first and second input transistors with the decoding transistors of the first number of decoding transistors interposed therebetween, and the clock circuit may provide the clock signal to a gate of each first input transistor and a gate of each second input transistor.

At block 530, method 500 may fabricate an output circuitry configured to provide a decoded address to a wordline driver circuit to thereby selectively access the at least one wordline from the multiple wordlines in the memory. In some implementations, the second stage for each block of the multiple decoding blocks may include first and second output transistors with the second number of decoding transistors interposed therebetween. The first stage for each block may provide a first decoding signal to a gate of each first output transistor. Further, the first stage for each block may provide the first decoding signal to a gate of each second output transistor.

In summary, to overcome deficiencies of typical/conventional approaches, the address decoding circuitry/circuits as described herein enable area efficient address decoding without pre-decoding address bits, thus resulting in low wiring overhead, and potentially lower area in memories. For instance, in some implementations, all address decoding activities may occur in the address decoding block area, which may refer to the post decode block area and/or the wordline drivers area. One advantage of this implementation may include having less wires and/or address lines.

Typical/conventional decode of address bits to generate a word-select (or wordline in memories) is usually done in 2 steps: pre-decode and post-decode. Generally, for several designs, such as heavily multi-ported designs, a width of a post-decode block (aka wordline drivers in memories) may be bounded by a large number of pre-decode lines. However, in contrast, various techniques described herein may refer to decoding address lines using only encoded address lines without explicitly using a complement version or a pre-decoded version of address lines. Thus, with the various techniques described herein, there may be no occurrence of pre-decoding done on any address line, i.e., only the encoded address lines may be sent to the wordline block, e.g., from control. As such, the decoding may occur in the wordline block using 2-stages with full dynamic decode gates (i.e., transistors) in an area efficient manner.

Further, in reference to area, various techniques described herein may refer to various efficiencies. For instance, since the address decoding circuitry described herein may not use any pre-decode logic, a number of devices in a control area may be less. This may be helpful in cases where a control height is larger than the height of the input/output (I/O), and it may be useful in heavily ported multi-port register file designs, where the control height may be larger than the height of I/O. With pre-decode circuitry removed, the height of control may be reduced, and overall height may be lower. This may be true for multi-port register files, where the width of the post-decode (and hence a control-wordline slice width) is governed by the number of vertical pre-decode wires.

With reference to timing, an address setup time for addresses may be reduced or lowered due to, e.g., an address path that may be significantly smaller (e.g., by at least 2 gate delays). Thus, in some instances, a combined metric of, "address setup time plus (+) access time," may therefore be improved.

Described herein are various implementations of an integrated circuit. In one implementation, the integrated circuit may include an input circuit configured to provide an encoded address via multiple address lines. The integrated circuit may include an address decoding circuit configured to directly translate the encoded address provided via the multiple address lines. The address decoding circuit may include multiple decoding blocks with each block having a first stage coupled to a second stage. The first stage of each block may include a first number of decoding transistors configured to decode first address bit values from the multiple address lines. The second stage of each block may include a second number of decoding transistors configured to decode second address data bit values from the multiple address lines. The first address bit values may be different than the second address bit values. The integrated circuit may include an output circuit configured to provide a decoded address to a wordline driver circuit in memory.

Described herein are various implementations of an address decoding circuit. In one implementation, the address decoding circuit may include multiple address lines configured to receive an encoded address as input. The address decoding circuit may include multiple decoding blocks configured to directly decode the encoded address provided via the multiple address lines. Each of the multiple decoding blocks may include multiple stages configured to decode one or more address bit values from the multiple address lines. The address decoding circuit may include multiple output lines configured to provide at least one decoded address to a wordline driver circuit.

Described herein are various implementations of an integrated circuit configured for address decoding. In one implementation, the integrated circuit may include input circuitry configured to provide an encoded address via multiple address lines. The integrated circuit may include address decoding circuitry configured to directly translate the encoded address provided via the multiple address lines. The address decoding circuit may include multiple decoding blocks with each block having multiple stages configured to decode one or more address bit values from the multiple address lines. The integrated circuit may include output circuitry configured to provide a decoded address to a wordline driver circuit.

The description provided herein may be directed to specific implementations. It should be understood that the description provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related constraints and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
an input circuit configured to provide an encoded address via multiple address lines;
an address decoding circuit configured to directly translate the encoded address provided via the multiple address lines, wherein the address decoding circuit comprises multiple decoding blocks with each block having a first stage coupled to a second stage, wherein the first stage of each block comprises a first number of decoding transistors configured to decode first address bit values from the multiple address lines, and wherein the second stage of each block comprises a second number of decoding transistors configured to decode second address data bit values from the multiple address lines, and wherein the first address bit values are different than the second address bit values;
an output circuit configured to provide a decoded address; and
a clock circuit configured to provide a clock signal to each block of the multiple decoding blocks,
wherein the first stage for each block of the multiple decoding blocks comprises first and second input transistors with the decoding transistors of the first number of decoding transistors interposed therebetween, and
wherein the clock circuit provides the clock signal to a gate of each first input transistor and a gate of each second input transistor.

2. The integrated circuit of claim 1, wherein:
each decoding transistor of the first number of decoding transistors of each first stage comprises an n-type metal-oxide-semiconductor (NMOS) transistor.

3. The integrated circuit of claim 1, wherein:
each first stage is configured to decode first address bit values associated with a data bit value of binary 1 (one) from each of the multiple address lines.

4. The integrated circuit of claim 1, wherein:
each decoding transistor of the second number of decoding transistors of each second stage comprises a p-type metal-oxide-semiconductor (PMOS) transistor.

5. The integrated circuit of claim 1, wherein:
each second stage is configured to decode second address bit values associated with a data bit value of binary 0 (zero) from each of the multiple address lines.

6. The integrated circuit of claim 1, wherein:
the address decoding circuit comprises a 4-to-16 decoding circuit,
the multiple address lines comprise at least 4 (four) address lines, and
the multiple decoding blocks comprise at least 16 (sixteen) decoding blocks.

7. The integrated circuit of claim 1, wherein:
the multiple decoding blocks comprise at least 16 (sixteen) decoding blocks, and
the decoded address bit values for each block of the at least 16 (sixteen) decoding blocks correspond to binary values for each block including at least one of 0000 for a value of 0 (zero), 0001 for a value of 1 (one), 0010 for a value of 2 (two), 0011 for a value of 3 (three), 0100 for a value of 4 (four), 0101 for a value of 5 (five), 0110 for a value of 6 (six), 0111 for a value of 7 (seven), 1000 for a value of 8 (eight), 1001 for a value of 9 (nine), 1010 for a value of 10 (ten), 1011 for a value of 11 (eleven), 1100 for a value of 12 (twelve), 1011 for a value of 13 (thirteen), 1110 for a value of 14 (fourteen), 1111 for a value of 15 (fifteen).

8. An integrated circuit, comprising:
an input circuit configured to provide an encoded address via multiple address lines;
an address decoding circuit configured to directly translate the encoded address provided via the multiple address lines, wherein the address decoding circuit comprises multiple decoding blocks with each block having a first stage coupled to a second stage, wherein the first stage of each block comprises a first number of decoding transistors configured to decode first address bit values from the multiple address lines, and wherein the second stage of each block comprises a second number of decoding transistors configured to decode second address data bit values from the multiple address lines, and wherein the first address bit values are different than the second address bit values; and an output circuit configured to provide a decoded address, wherein:

the address decoding circuit uses 5 (five) wire lines including 4 (four) address lines of the multiple address lines configured to provide the encoded address to each block of the multiple decoding blocks and 1 (one) clock line configured to provide a clock signal to each block of the multiple decoding blocks.

9. The integrated circuit of claim 1, wherein:

each block of the multiple decoding blocks comprises a combination of at least 4 (four) decoding transistors for decoding the first and second address bit values from the multiple address lines, the first number of decoding transistors of each first stage comprises a number of 0 (zero) to 4 (four) decoding transistors configured to decode the first address bit values from the multiple address lines, and the second number of decoding transistors of each second stage comprises a number of 0 (zero) to 4 (four) decoding transistors configured to decode the second address bit values from the multiple address lines.

10. The integrated circuit of claim 1, wherein:

each first input transistor of the first stage for each block of the multiple decoding blocks comprises a n-type metal-oxide-semiconductor (NMOS) transistor, and each second input transistor of the first stage for each block of the multiple decoding blocks comprises a p-type metal-oxide-semiconductor (PMOS) transistor.

11. The integrated circuit of claim 1, wherein:

the second stage for each block of the multiple decoding blocks comprises first and second output transistors with the decoding transistors of the second number of decoding transistors interposed therebetween, the first stage for each block of the multiple decoding blocks provides a first decoding signal to a gate of each first output transistor and a gate of each second output transistor, and the second stage for each block of the multiple decoding blocks provides a second decoding signal to the output circuit for selectively accessing the at least one wordline from the multiple wordlines in the memory.

12. The integrated circuit of claim 11, wherein:

each first output transistor of the second stage for each block of the multiple decoding blocks comprises a n-type metal-oxide-semiconductor (NMOS) transistor, and each second output transistor of the second stage for each block of the multiple decoding blocks comprises a p-type metal-oxide-semiconductor (PMOS) transistor.

13. The integrated circuit of claim 1, wherein:

the multiple address lines bypass a pre-decode circuit for directly translating the encoded address using only the multiple address lines.

14. An address decoding circuit, comprising:

multiple address lines configured to receive an encoded address as input;

multiple decoding blocks configured to directly decode the encoded address provided via the multiple address lines, each of the multiple decoding blocks having multiple stages configured to decode one or more address bit values from the multiple address lines;

multiple output lines configured to provide at least one decoded address; and a clock circuit configured to provide a clock signal to each block of the multiple decoding blocks, wherein the first stage for each block of the multiple decoding blocks comprises first and second input transistors with the decoding transistors of the first number of decoding transistors interposed therebetween, and wherein the clock circuit provides the clock signal to a gate of each first input transistor and a gate of each second input transistor.

15. The address decoding circuit of claim 14, wherein:

each of the multiple stages of each block comprises a first stage coupled to a second stage, the first stage of each block comprises a first number of decoding transistors configured to decode first address bit values from the multiple address lines, the second stage of each block comprises a second number of decoding transistors configured to decode second address data bit values from the multiple address lines, and the first address bit values are different than the second address bit values.

16. An integrated circuit, comprising:

input circuitry configured to provide an encoded address via multiple address lines;

address decoding circuitry configured to directly translate the encoded address provided via the multiple address lines, the address decoding circuitry having multiple decoding blocks with each block having multiple stages configured to decode one or more address bit values from the multiple address lines;

output circuitry configured to provide a decoded address; and a clock circuit configured to provide a clock signal to each block of the multiple decoding blocks, wherein the first stage for each block of the multiple decoding blocks comprises first and second input transistors with the decoding transistors of the first number of decoding transistors interposed therebetween, and wherein the clock circuit provides the clock signal to a gate of each first input transistor and a gate of each second input transistor.

17. The integrated circuit of claim 16, wherein:

each of the multiple stages of each block comprises a first stage coupled to a second stage, the first stage of each block comprises a first number of decoding transistors configured to decode first address bit values from the multiple address lines, the second stage of each block comprises a second number of decoding transistors configured to decode second address data bit values from the multiple address lines, and the first address bit values are different than the second address bit values.

* * * * *